(12) United States Patent
Kaskey et al.

(10) Patent No.: US 8,914,143 B1
(45) Date of Patent: Dec. 16, 2014

(54) METHOD AND SYSTEM FOR HANDLING SUBSTRATES

(75) Inventors: Jeffrey Kaskey, Livermore, CA (US); Thomas Laidig, Richmond, CA (US); Dave Markle, Saratoga, CA (US); Jang-Fung Chen, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 808 days.

(21) Appl. No.: 13/098,296

(22) Filed: Apr. 29, 2011

Related U.S. Application Data

(60) Provisional application No. 61/330,244, filed on Apr. 30, 2010.

(51) Int. Cl.
*G06F 19/00* (2011.01)
*G03F 9/00* (2006.01)

(52) U.S. Cl.
USPC .......................................... 700/114; 700/121

(58) Field of Classification Search
None
See application file for complete search history.

(56) References Cited

U.S. PATENT DOCUMENTS

| | | | |
|---|---|---|---|
| 7,659,964 B2 * | 2/2010 | Lin et al. | 355/72 |
| 2002/0094260 A1 * | 7/2002 | Coomer et al. | 414/416.09 |
| 2006/0219605 A1 * | 10/2006 | Devitt | 209/37 |
| 2009/0067114 A1 * | 3/2009 | Balan | 361/234 |
| 2010/0080680 A1 * | 4/2010 | Okamoto et al. | 414/737 |
| 2010/0195080 A1 * | 8/2010 | Compen et al. | 355/72 |
| 2011/0186555 A1 * | 8/2011 | Bruland et al. | 219/121.75 |

\* cited by examiner

*Primary Examiner* — Sean Shechtman
*Assistant Examiner* — Steven Garland
(74) *Attorney, Agent, or Firm* — Silicon Valley Patent Group LLP; Thomas Chan

(57) ABSTRACT

System and method for handling substrates in a lithography manufacturing process are disclosed. In one embodiment, a system for handling substrates in a lithography manufacturing process includes a plurality of porous chucks positioned above a substrate for imaging, a plurality of pressure sources configured to apply pressured air towards the substrate through the plurality of porous chucks, a plurality of vacuums configured to apply suction force away from the substrate, and a controller with control logic configured to hold the substrate in place by controlling the pressured air applied by the plurality of pressure sources and the suction force generated by the plurality of vacuums.

18 Claims, 3 Drawing Sheets

METHOD AND SYSTEM FOR HANDLING SUBSTRATES

CROSS REFERENCE TO RELATED APPLICATIONS

This application claims the benefit of U.S. provisional application No. 61/330,244, "Method and System for Handling Substrates" filed Apr. 30, 2010. The aforementioned United States application is hereby incorporated by reference in its entirety.

FIELD OF THE INVENTION

The present invention relates to the field of lithography for manufacturing. In particular, the present invention relates to system and method for handling substrates in a lithography manufacturing process.

BACKGROUND OF THE INVENTION

Many modern display systems require projection of high resolution images or conducting image sensing across large, thin materials, such as substrates. These requirements continue to become more difficult to meet as the demand increases for greater size and resolution while simultaneously reducing cost and time. FIG. 1 illustrates a conventional system of using a vacuum chuck to hold an object in a manufacturing process. As shown in FIG. 1, a workpiece 102 (also referred to as an object, which can be a substrate) is placed on top of a vacuum chuck 104. When the air pressure of the vacuum chuck is turned off 106 (left figure), the atmosphere within the chamber maintains a constant pressure around the workpiece 102 and within the vacuum chuck 104. When a vacuum chuck is turned on 108 (right figure), the air pressure decreases below the workpiece 102 which causes higher air pressure above the object 102 to want to fill this low pressure space below it. Thus, the workpiece 102 is pressed and held against the chuck 104.

In applications where the projection is used to expose a pattern or otherwise transfer an image, conventional methodologies and systems often call for the use of manufactured masks, which require long time and high cost to fabricate. In typical production environments and in particular in production runs, a low volume production would make the time and cost of manufacturing such a mask even more significant. Therefore, it would be desirable to have methodologies and systems that can generate the pattern on the fly.

SUMMARY

The present invention relates to systems and methods for handling substrates in a lithography manufacturing process. In one embodiment, a system for handling substrates in a lithography manufacturing process includes a plurality of porous chucks positioned above a substrate for imaging, a plurality of pressure sources configured to apply pressured air towards the substrate through the plurality of porous chucks, a plurality of vacuums configured to apply suction force away from the substrate, and a controller with control logic configured to hold the substrate in place by controlling the pressured air applied by the plurality of pressure sources and the suction force generated by the plurality of vacuums. The substrate can be a roll-to-roll flexible substrate, and wherein the plurality of porous chucks covers a portion of area of the substrate.

The system further includes a plurality of optical paths, where each optical path includes an imaging unit that images a corresponding area of the substrate, control logic configured to detect mechanical and optical variations in a subarea of the substrate corresponding to each optical path; and control logic configured to compensate for the mechanical and optical variations detected in each optical path.

The control logic configured to compensate for the mechanical and optical variations includes control logic configured to modulate balance of the pressured air and the suction force to control distance of each optical path, control logic configured to detect focus of the subarea of the substrate corresponding to each optical path, and control logic configured to adjust focus for imaging the subarea of the substrate. Modulating balance of the pressured air and the suction force can be implemented by control logic configured to control balance of local air pressure and suction force for each subarea of the substrate independently.

The control logic configured to adjust focus includes control logic configured to adjust focus of each subarea of the substrate with respect to its corresponding optical path independently, which further includes control logic configured to adjust focus for static exposure of substrate, and control logic configured to adjust focus for dynamic exposure of substrate.

The system further includes control logic configured to place the plurality of pressure sources and the plurality of vacuums to provide local control of edges of the substrate and control logic configured to apply the suction force concentric to each of the optical paths. In addition, the system also includes control logic configured to modulate each of the plurality of porous chucks with corresponding acoustic signals, control logic configured to sense the acoustic signals on a handler of the substrate, and control logic configured to monitor separation of substrate from each of the plurality of porous chucks and the handler using the acoustic signals. The acoustic signals can be transmitted from the handler and received at the plurality of porous chucks.

In another embodiment, a method for handling substrates in a lithography manufacturing process includes providing a substrate for imaging, wherein the substrate is positioned underneath a plurality of porous chucks, applying pressured air towards the substrate through the plurality of porous chucks using a plurality of pressure sources, applying suction force away from the substrate using a plurality of vacuums, and holding the substrate in place by controlling the pressured air applied by the plurality of pressure sources and the suction force generated by the plurality of vacuums. The substrate can be a roll-to-roll flexible substrate, and the plurality of porous chucks covers a portion of area of the substrate.

With this method, holding the substrate in place may be accomplished by creating a plurality of optical paths, where each optical path includes an imaging unit that images a corresponding area of the substrate, detecting mechanical and optical variations in a subarea of the substrate corresponding to each optical path, and compensating for the mechanical and optical variations detected in each optical path.

To compensate for the mechanical and optical variations, the method modulates balance of the pressured air and the suction force to control distance of each optical path, detects focus of the subarea of the substrate corresponding to each optical path, and adjusts focus for imaging the subarea of the substrate. The method of modulating balance of the pressured air and the suction force can be accomplished by controlling balance of local air pressure and suction force for each subarea of the substrate independently. The method of adjusting focus can include adjusting focus of each subarea of the substrate with respect to its corresponding optical path independently. And adjusting focus can include adjusting focus for static exposure of substrate; and adjusting focus for dynamic exposure of substrate.

The method further includes placing the plurality of pressure sources and the plurality of vacuums to provide local control of edges of the substrate, and applying the suction force concentric to each of the optical paths. In addition, the method also includes modulating each of the plurality of porous chucks with corresponding acoustic signals, sensing the acoustic signals on a handler of the substrate, and monitoring separation of substrate from each of the plurality of porous chucks and the handler using the acoustic signals. The acoustic signals can be transmitted from the handler and received at the plurality of porous chucks.

BRIEF DESCRIPTION OF THE DRAWINGS

The aforementioned features and advantages of the invention, as well as additional features and advantages thereof, will be more clearly understandable after reading detailed descriptions of embodiments of the invention in conjunction with the following drawings.

Like numbers are used throughout the specification.

DESCRIPTION OF EMBODIMENTS

System and method are provided for handling substrates in a lithography manufacturing process. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

One of the drawbacks of conventional systems is the issue of varying thickness of substrate and varying focus position of optic path. For example, in a fine focus system, mechanical reference to the rear of a substrate, as provided by a translating stage with vacuum chuck, is often insufficient, given the variations in thickness across a substrate as well as from substrate to substrate. A precise focus reference needs to be established to the front surface without mechanical contact to that front surface. Small variations in the optics and their placement within the optical path further mean that a single fixed mechanical position is insufficient. Mechanically adjusted systems may be used, but the mechanical complexity can compromise the mechanical stability of the optical system.

Figure 1:
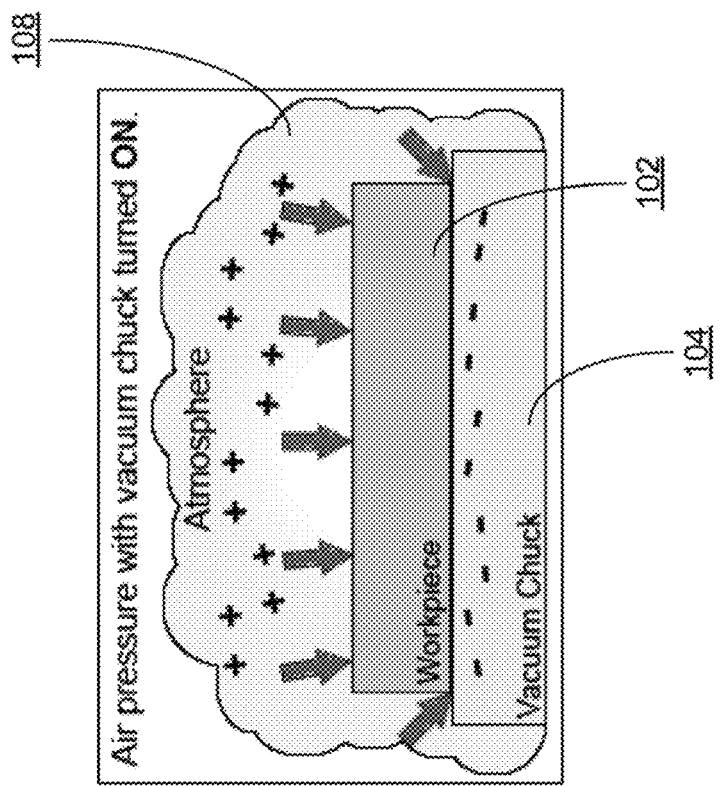
FIG. 1 illustrates a conventional method of using a vacuum chuck to hold an object in a manufacturing process.
Figure 1:
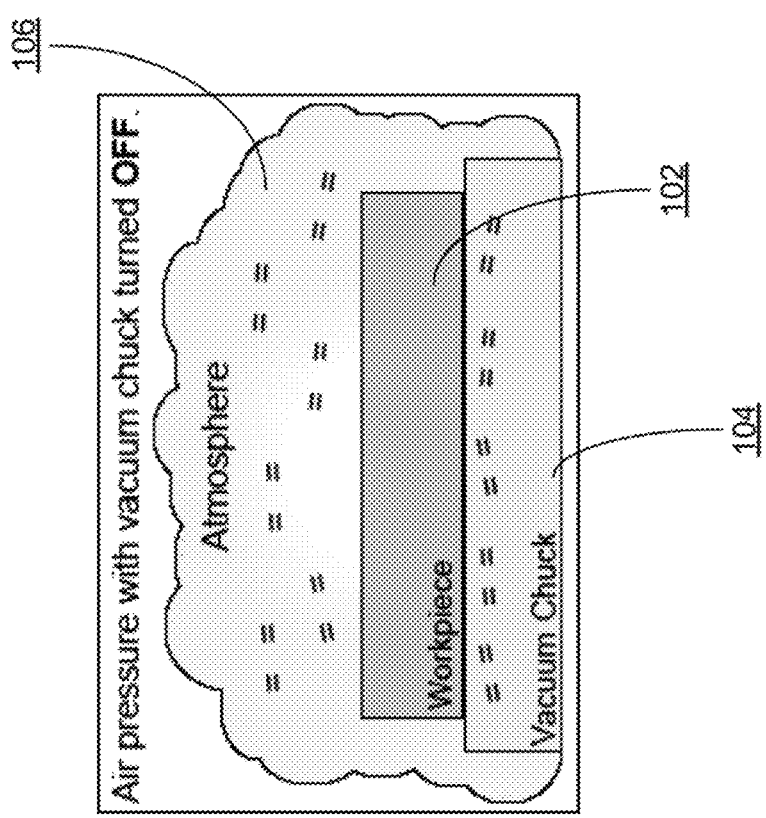
Figure 2:
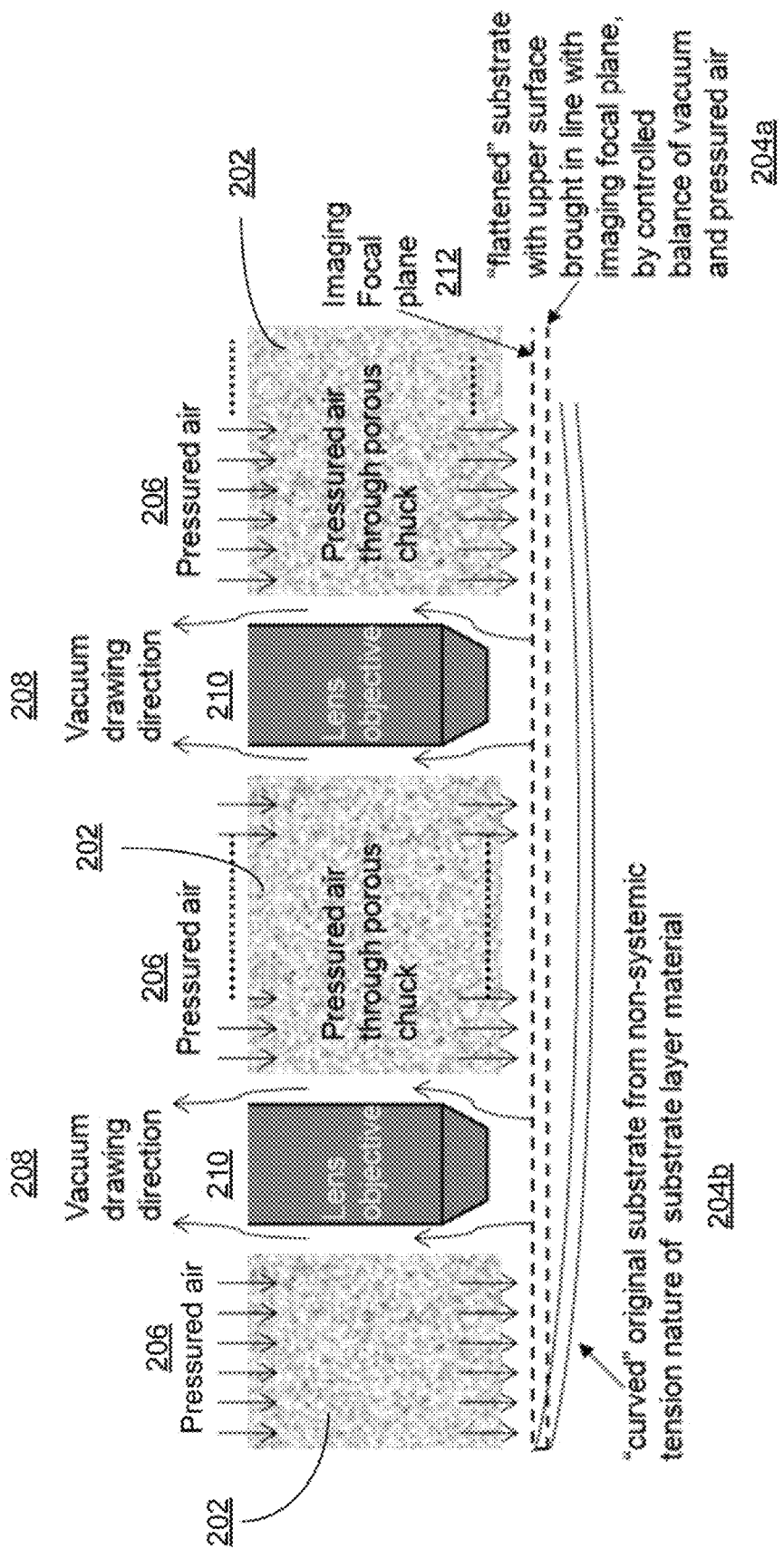
FIG. 2 illustrates a method and system for handling substrates according to embodiments of the present invention.

FIG. 2 illustrates a method and system for handling substrates according to embodiments of the present invention. As shown in FIG. 2, one solution to address the above issue is to place a chuck on same side as substrate front surface. In this solution, a loaded pressure air chuck 202 (LPAC) is used to support the substrate 204b. The substrate front surface is supported on a cushion of air and is stabilized with a compressing load against the air pressure 206 (also referred to as pressured air) by a non-rigid means such as vacuum 208 or mechanical tension, for instance by a large roll of substrate material (204a/204b). Note that the pressured air 206 may be generated by a single pump feeding a group of pressure regulators (not shown) or by a plurality of pumps with each pump associated with a corresponding porous chuck (not shown). In either of these exemplary implementations, a plurality of pressure sources can be formed to apply pressured air through a corresponding porous chuck 202 to the substrate 204a/204b.

The height of the substrate front surface is controlled by modulating the air pressure 206 proximate to the optical path, and therefore affecting a small flex in the substrate to bring it locally to the correct position 204a as determined by other means such as focus detection in the optical path. The optical path is mechanically fixed and is therefore rigid; the air supported substrate provides the fine focus adjustment. This adjustment can be either static for the full exposure or dynamic as the substrate is scanned. A variation of this solution may allow the preloading pressure, such as vacuum, electrostatic, mechanical, to be varied along with, or instead of, the air pressure.

Another drawback of the conventional systems is the issue of obtaining focus across multiple optical paths. In order to image or sense quickly at high resolution over large areas, it is desired to use many imaging or sensing (optical) paths. Each optical path is likely to have a slightly different point of focus so it is impractical to create a single focus mechanism across the entire substrate. To address this issue, a practical requirement is to control substrate distance with reference to the projection or sensed (front) surface of the substrate, also referred to as image focal plane 212, and moreover, to control that distance individually for each optical path.

One approach to meet the above requirement is to use an individually controlled focus through the control of local air pressure or vacuum air balance. In one approach, a plurality of vacuums (not shown) may be used to generate a suction force that balances the pressured air and thus holds the substrate in place. Each vacuum may be used with an opening of a corresponding optical path. This approach is based on the LPAC solution described above, where each optical path, which includes lens 210 (also referred to as lens objective) has separate control of the air pressure (or pressure loading counter-force) proximate to its optical path. This method allows compensation for mechanical and optical variations in each separate optical path across the substrate. As with the LPAC solution, this compensation may be provided statically or dynamically. In other approaches, the plurality of vacuums may be implemented with a single vacuum with separate air path coupled to each of the optical path (not shown). Each separate air path can be controlled individually with a pressure regulator.

Yet another drawback of the conventional systems is the challenge to maintain a flat substrate. For instance, problems are found in conventional air-supported substrate when the substrate has an inherent tendency towards some amount of physical distortion such as single or compound curvature 204b. These distortions are even worse at the edges of substrates where the local air pressure and compressive loading may vary based on their proximity to the edge.

To maintain a flat substrate 204a, one approach is through the placement of application pressured air and vacuum suction. The positional restriction provided by the spring stiffness of a loaded, air-supported surface compensates for typical substrate distortions across the substrate body. Additionally, the solution for maintaining a flat substrate introduces local control of edge effects by specific sizing and placement of both the pressure and loading forces. In particular, applying vacuum concentric to the optics themselves, in the case where vacuum is among the compressive loading forces, stabilizes the substrate surface during translation which brings the substrate edge close to the optics.

Another approach to maintain a flat substrate is by controlling the loading of the substrate. Besides keeping a non-flat substrate within proper focusing distances, the approach ensures that when such a substrate is mounted it does not physically contact the chuck or show other undesired behavior. By mating the substrate to the chuck in a proper sequence of positions and angles, the mating process is designed to be sufficiently deterministic so as to assure no mechanical contact with the chuck and no inadvertent misalignment may occur.

Yet another drawback of the conventional systems is the issue of detecting mechanical touchdown of substrate to chuck. When a substrate front surface is mounted to an air chuck, it is critical to monitor successful transfer of the substrate to the chuck to insure no mechanical contact. Touchdown may be hard to detect as it is likely being a short duration, a low force, and only a point contact. Further, substrates cannot be assumed to have surfaces conditioned for easy detection by such means as conductive layers.

One solution to detect the touchdown of substrate is to use the method of acoustic coupling touchdown detection. By modulating the chuck with an acoustic signal and sensing for the same signal on the handler or stage, touch-down will be detected as a significant and abrupt increase in the sensed signal on the handler or stage. In one implementation, the acoustic signal is low amplitude so as not to be detrimental to the chuck, and high frequency to allow for fast detection. An alternative to this solution would be to have the driver (not shown, also referred to as acoustic signal generator or transmitter) on the handler/stage and the acoustic signal receiver (not shown) on the chuck, or vice versa.

There are numerous benefits can be achieved by the above disclosed solutions. With the receiver on the stage/handler, white noise from air and vacuum system on the chuck are less likely to swamp the receiver, and in fact may act to increase the signal received upon touch-detection. The receiver on the chuck, high frequency oscillations are not being driven to the chuck, reducing detrimental effects on optics and other hardware attached to the chuck.

Figure 3:
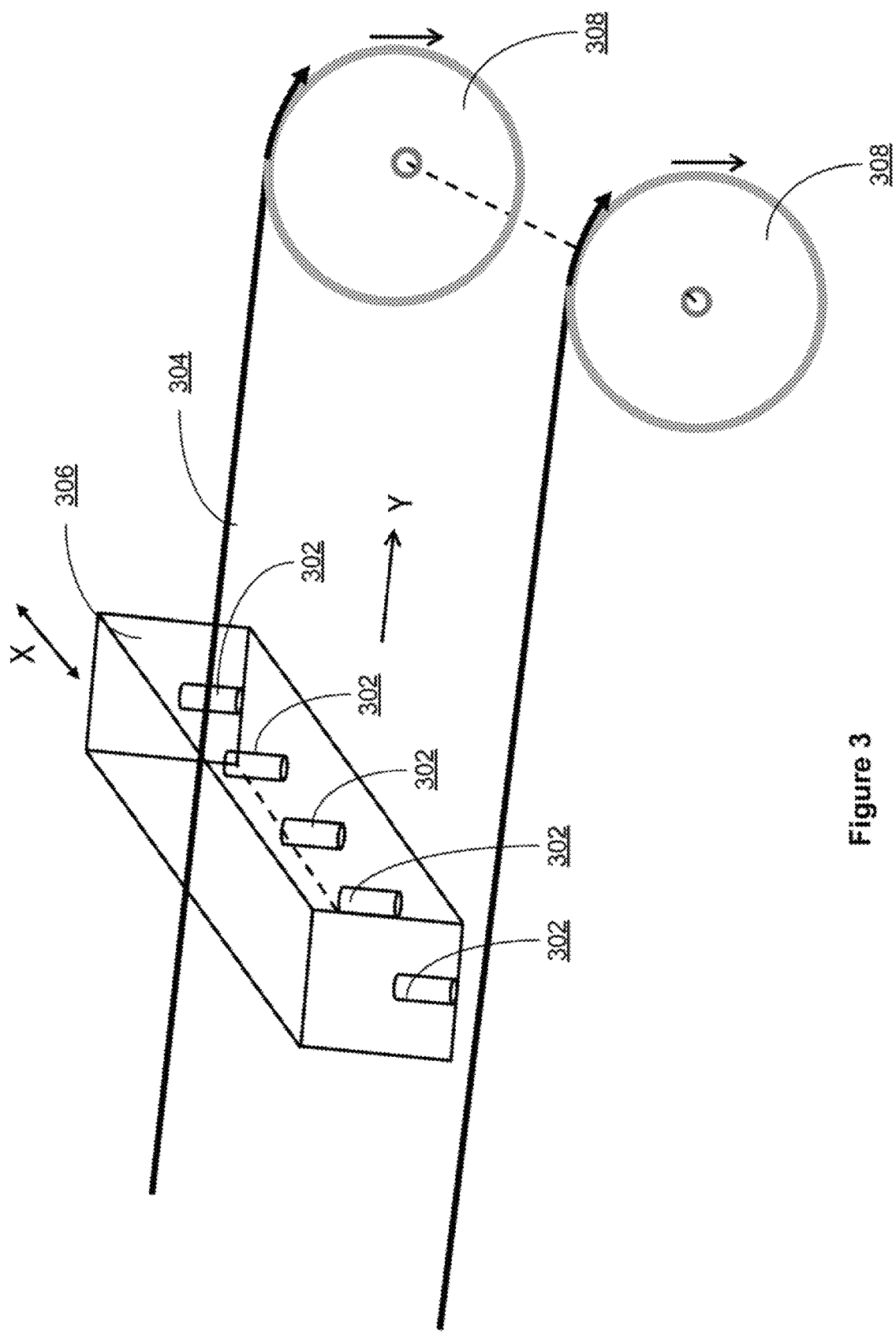
FIG. 3 illustrates a method of using a linear array of imaging units for roll-to-roll maskless lithography according to embodiments of the present invention.

FIG. 3 illustrates a method of using a linear array of imaging units for roll-to-roll maskless lithography according to embodiments of the present invention. In the exemplary embodiment shown in FIG. 3, a roll-to-roll flexible substrate 304 passes through a linear array of lens 302 embedded in a plurality of porous chuck 306. In this example, the chuck 306 does not need to cover the entire exposure area, but to keep maintaining focus within a rectangular exposing area underneath the chuck. The exposure method can be carried out by scanning in X with the lens-chuck module and in Y by the direction of roll-to-roll movement controlled by a pair of rollers.

Note that in this example, the imaging units 302 are arranged as a single line array as shown in FIG. 3. The substrate 304 may be controlled to move along the direction of substrate movement (the X direction) and the linear array of imaging units 302 may be controlled to move back and forth perpendicular to the direction of substrate movement (the Y direction) in the plane of the substrate 304. The exposure of the linear array of imaging units can be tuned to process certain area of the substrate 304 in synchronization with the roll-to-roll substrate movement. In this way, the linear array of imaging units may be controlled to image a substrate that has physical dimensions larger than the size of the linear array of imaging units. Because of the ability to control the imaging units to move in the direction of substrate movement as well as in the direction perpendicular to the substrate movement, the image writer system shown in FIG. 3 overcomes the size limitations of the physical masks required in the conventional methods.

According to embodiments of the present disclosure, a two dimensional array of imaging units (not shown) may be employed for roll-to-roll maskless lithography. Similar to the example of linear array of imaging units shown in FIG. 3, the substrate 304 may be controlled to move in the X direction and the two dimensional array of imaging units may be controlled to move back and forth in the Y direction in the plane of the substrate 304. The exposure of the two dimensional array of imaging units can be tuned to process certain area of the substrate 304 in synchronization with the roll-to-roll substrate movement. In this way, the two dimensional array of imaging units may be controlled to image a substrate that has physical dimensions larger than the size of the two dimensional array of imaging units. Thus, the image writer system can overcome the size limitations of the physical masks required in the conventional methods. Note that in some embodiments, the two dimensional array of imaging units may be formed in a staggered or non-staggered array formation (not shown). Note that in yet another approach, with a sufficiently large staggered 2-dimensional array of imaging units, the imaging system can be configured to scan in the Y-direction only, with each imaging unit expose a narrow swath of the substrate, and these swaths may overlap, thus avoiding the complexity of having the system to scan in the X-direction.

Person skilled in the art would appreciate that the disclosed solutions facilitate full production runs, test and prototype runs, fast turn for corrections and customization within a manufacturing run. The disclosed solutions can improve speed, increase resolution and reduce cost and time to manufacture in applications of on-the-fly projection and sensing on substrates. In particular, applications of the disclosed solutions are advantageous in systems that comprise multiple optical paths to reduce the area that may be swept by each optical path during scanning. Representative applications may include lithography for manufacturing flat panel displays, flexible panel displays, image display manufactured in a roll-to-roll or equivalent substrate, printing circuit board (PCB), inspection, and alignment.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processors or controllers. Hence, references to specific functional units are to be seen as references to suitable means for providing the described functionality rather than indicative of a strict logical or physical structure or organization.

The method and system of the present disclosure can be implemented in any suitable form, including hardware, software, firmware, or any combination of these. The invention may optionally be implemented partly as computer software running on one or more data processors and/or digital signal processors. The elements and components of an embodiment of the invention may be physically, functionally, and logically implemented in any suitable way. Indeed, the functionality may be implemented in a single unit, in a plurality of units, or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as suited to the particular use contemplated.

What is claimed is:

1. A method for handling substrates in a lithography manufacturing process, comprising:
    providing a substrate for imaging, wherein the substrate is positioned underneath a plurality of porous chucks;
    applying pressured air towards the substrate through the plurality of porous chucks using a plurality of pressure sources;
    applying suction force away from the substrate using a plurality of vacuums; and
    holding the substrate in place by controlling the pressured air applied by the plurality of pressure sources and the suction force generated by the plurality of vacuums, wherein holding the substrate in place comprises: creating a plurality of optical paths, wherein each optical path includes an imaging unit that images a corresponding area of the substrate; detecting mechanical and optical variations in a subarea of the substrate corresponding to each optical path; and compensating for the mechanical and optical variations detected in each optical path.

2. The method of claim 1, wherein
    the substrate is a roll-to-roll flexible substrate, and wherein the plurality of porous chucks covers a portion of area of the substrate.

3. The method of claim 1, wherein compensating for the mechanical and optical variations comprises:
    modulating balance of the pressured air and the suction force to control distance of each optical path;
    detecting focus of the subarea of the substrate corresponding to each optical path; and
    adjusting focus for imaging the subarea of the substrate.

4. The method of claim 3, wherein modulating balance of the pressured air and the suction force comprises:
    controlling balance of local air pressure and suction force for each subarea of the substrate independently.

5. The method of claim 3, wherein adjusting focus comprises:
    adjusting focus of each subarea of the substrate with respect to its corresponding optical path independently.

6. The method of claim 5, wherein adjusting focus comprises:
    adjusting focus for static exposure of substrate; and
    adjusting focus for dynamic exposure of substrate.

7. The method of claim 1 further comprises:
    placing the plurality of pressure sources and the plurality of vacuums to provide local control of edges of the substrate; and
    applying the suction force concentric to each of the optical paths.

8. The method of claim 1 further comprises:
    modulating each of the plurality of porous chucks with corresponding acoustic signals;
    sensing the acoustic signals on a handler of the substrate; and
    monitoring separation of substrate from each of the plurality of porous chucks and the handler using the acoustic signals.

9. The method of claim 8, wherein the acoustic signals are transmitted from the handler and received at the plurality of porous chucks.

10. A system for handling substrates in a lithography manufacturing process, comprising:
    a plurality of porous chucks positioned above a substrate for imaging;
    a plurality of pressure sources configured to apply pressured air towards the substrate through the plurality of porous chucks;
    a plurality of vacuums configured to apply suction force away from the substrate;
    a controller with control logic configured to hold the substrate in place by controlling the pressured air applied by the plurality of pressure sources and the suction force generated by the plurality of vacuums;
    a plurality of optical paths, wherein each optical path includes an imaging unit that images a corresponding area of the substrate;
    control logic configured to detect mechanical and optical variations in a subarea of the substrate corresponding to each optical path; and
    control logic configured to compensate for the mechanical and optical variations detected in each optical path.

11. The system of claim 10, wherein
    the substrate is a roll-to-roll flexible substrate, and wherein the plurality of porous chucks covers a portion of area of the substrate.

12. The system of claim 10, wherein control logic configured to compensate for the mechanical and optical variations comprises:
    control logic configured to modulate balance of the pressured air and the suction force to control distance of each optical path;
    control logic configured to detect focus of the subarea of the substrate corresponding to each optical path; and
    control logic configured to adjust focus for imaging the subarea of the substrate.

13. The system of claim 12, wherein control logic configured to modulate balance of the pressured air and the suction force comprises:
    control logic configured to control balance of local air pressure and suction force for each subarea of the substrate independently.

14. The system of claim 12, wherein control logic configured to adjust focus comprises:
    control logic configured to adjust focus of each subarea of the substrate with respect to its corresponding optical path independently.

15. The system of claim 14, wherein control logic configured to adjust focus of each subarea comprises:
    control logic configured to adjust focus for static exposure of substrate; and
    control logic configured to adjust focus for dynamic exposure of substrate.

16. The system of claim 10 further comprises:
    control logic configured to place the plurality of pressure sources and the plurality of vacuums to provide local control of edges of the substrate; and control logic configured to apply the suction force concentric to each of the optical paths.

17. The system of claim 10 further comprises:
control logic configured to modulate each of the plurality of porous chucks with corresponding acoustic signals;
control logic configured to sense the acoustic signals on a handler of the substrate; and
control logic configured to monitor separation of substrate from each of the plurality of porous chucks and the handler using the acoustic signals.

18. The system of claim 17, wherein the acoustic signals are transmitted from the handler and received at the plurality of porous chucks.

* * * * *